US007667281B2

(12) United States Patent
Koemtzopoulos et al.

(10) Patent No.: US 7,667,281 B2
(45) Date of Patent: Feb. 23, 2010

(54) METHOD FOR HARD MASK CD TRIM

(75) Inventors: C. Robert Koemtzopoulos, Castro Valley, CA (US); Shibu Gangadharan, Fremont, CA (US); Chris G. N. Lee, Kensington, CA (US); Alan Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 75 days.

(21) Appl. No.: 11/767,339

(22) Filed: Jun. 22, 2007

(65) Prior Publication Data
US 2007/0249177 A1 Oct. 25, 2007

Related U.S. Application Data

(63) Continuation of application No. 10/641,388, filed on Aug. 13, 2003, now Pat. No. 7,425,277.

(60) Provisional application No. 60/402,977, filed on Aug. 13, 2002.

(51) Int. Cl.
*H01L 29/78* (2006.01)
*H01L 21/331* (2006.01)
(52) U.S. Cl. ............... 257/410; 257/510; 257/E21.038; 257/E21.023; 257/E21.035; 257/235; 438/229; 438/313

(58) Field of Classification Search .................. 257/410, 257/510, E21.038, E21.023, E21.035, E21.037, 257/E21.235, E21.246; 438/229, 313
See application file for complete search history.

(56) References Cited

U.S. PATENT DOCUMENTS

| 6,218,309 B1 * | 4/2001 | Miller et al. ................. 438/700 |
| 6,664,156 B1 * | 12/2003 | Ang et al. ..................... 438/229 |
| 6,821,713 B1 * | 11/2004 | Holbrook et al. ............ 430/313 |
| 2002/0076877 A1 * | 6/2002 | Gupta et al. ................. 438/230 |
| 2002/0127763 A1 * | 9/2002 | Arafa et al. ................... 438/76 |
| 2003/0027414 A1 * | 2/2003 | Ko ............................... 438/595 |
| 2007/0254461 A1 * | 11/2007 | Wei et al. ..................... 438/514 |

* cited by examiner

*Primary Examiner*—Howard Weiss
*Assistant Examiner*—Steven H Rao
(74) *Attorney, Agent, or Firm*—Martine Penilla & Gencarella, LLP

(57) ABSTRACT

Broadly speaking, methods and an apparatus are provided for removing an inorganic material from a substrate. More specifically, the methods provide for removing the inorganic material from the substrate through exposure to a high density plasma generated using an inductively coupled etching apparatus. The high density plasma is set and controlled to isotropically contact particular regions of the inorganic material to allow for trimming and control of a critical dimension associated with the inorganic material.

13 Claims, 16 Drawing Sheets

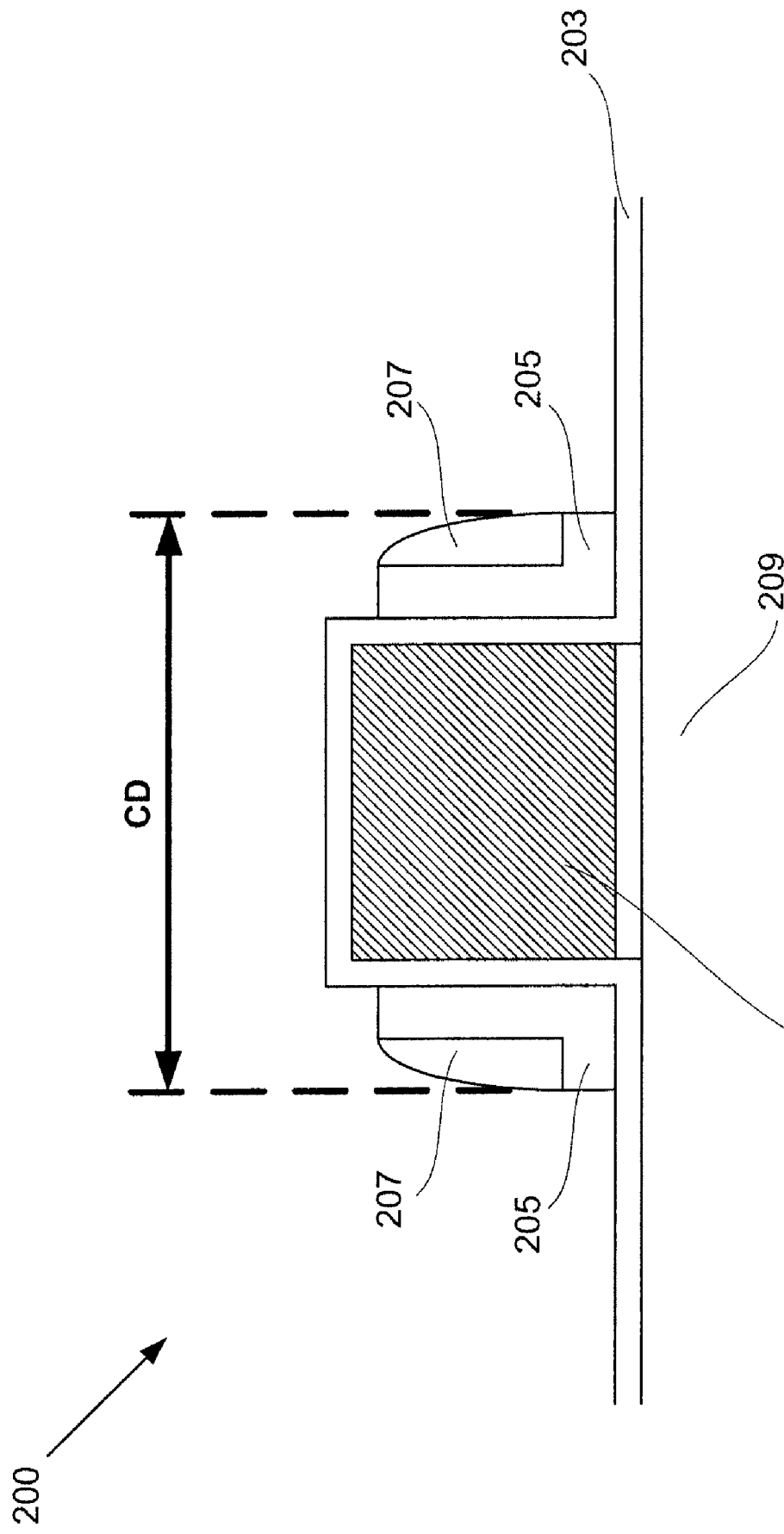

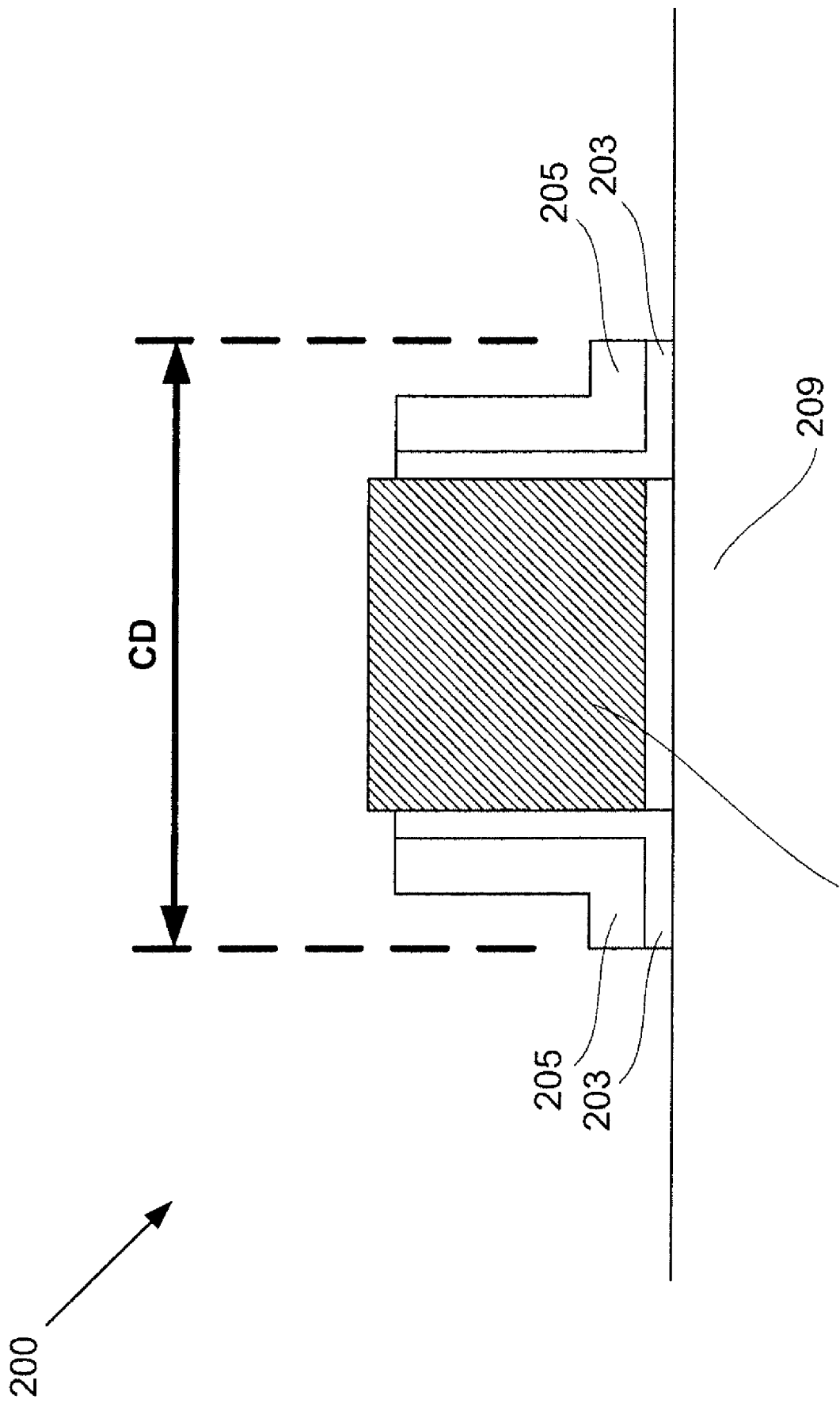

Mean:  211 Å/min
3-sigma:  22 Å/min (10%)

Mean:  137 Å/min
3-sigma:  20 Å/min (14%)

Mean: 320 Å/min
3-sigma: 12 Å/min (3%)

Mean: 623 Å/min
3-sigma: 36 Å/min (5%)

Oxide

Mean: 144 Å/min
3-sigma: 63 Å/min

Nitride

Mean: 1040 Å/min
3-sigma: 192 Å/min (18%)

Pre

Mean : 274.2 nm
3-sigma: 8.5 nm (± 3.1%)
Range : 10.3 nm (± 1.9 %)

Post

Mean : 239.7 nm
3-sigma: 12.8 nm (± 5.4%)
Range : 16.2 nm (± 3.4 %)

METHOD FOR HARD MASK CD TRIM

CLAIM OF PRIORITY

This application is a continuation of prior U.S. application Ser. No. 10/641,388, filed on Aug. 13, 2003, now U.S. Pat. No. 7,425,277 which claims priority from U.S. Provisional Application No. 60/402,977, filed on Aug. 13, 2002. The disclosure of each above-identified application is incorporated herein by reference.

BACKGROUND OF THE INVENTION

1. Field of the Invention

The present invention relates generally to semiconductor manufacturing. More specifically, the present invention relates to an etching process to be performed during semiconductor manufacturing.

2. Description of the Related Art

Etching processes are commonly and repeatedly carried out during the manufacture of a semiconductor wafer ("wafer"). As is well known to those skilled in the art, there are two types of etching processes: wet etching and dry etching. Dry etching is typically performed using either a capacitively coupled or an inductively coupled plasma etching apparatus.

An etching process is often used to define a particular feature on a surface of the wafer. One or more dimensions of the feature may be considered a critical dimension. As features become smaller and more closely spaced on the surface of the wafer, critical dimension uniformity across the wafer becomes a greater concern. In particular, critical dimension trim becomes more of a critical path operation to be examined for uniformity. Critical dimension trim refers to the amount of lateral etch that occurs on a side of the feature from which the critical dimension is measured. Therefore, uniformity of critical dimension trim influences the adequacy of both the size of features and the spacing between features.

Etching processes to remove oxide and nitride materials have been traditionally performed using a dielectric etcher. The dielectric etcher is capacitively coupled and, as such, does not provide adequate uniformity across the wafer with respect to critical dimension trim. Additionally, the dielectric etcher does not allow for control of critical dimension trim during the etching process.

In view of the foregoing, there is a need for a method and apparatus for providing uniform trim of oxide and nitride materials that are relevant to critical dimensions of features distributed across the wafer.

SUMMARY OF THE INVENTION

Broadly speaking, an invention is provided for removing an inorganic material from a substrate. More specifically, the present invention provides methods for removing the inorganic material from the substrate through exposure to a high density plasma generated using an inductively coupled etching apparatus. The high density plasma is set and controlled to isotropically contact particular regions of the inorganic material to allow for trimming and control of a critical dimension associated with the inorganic material.

In one embodiment, a method for etching is disclosed. The method includes an operation for exposing an inorganic material to a high density plasma. A surface of the inorganic material exposed to the high density plasma is defined by regions having different orientations with respect a source of the high density plasma. Some regions of the inorganic material are substantially parallel to the source of the high density plasma. Other regions are not parallel to the source of the high density plasma. The method further includes an operation for setting the high density plasma to isotropically contact both the regions of the inorganic material that are substantially parallel to the source of the high density plasma and the regions that are not parallel to the source. The contact causes the inorganic material to be etched from each region of the surface.

In another embodiment, a method for trimming an inorganic material is disclosed. The method includes an operation for placing a substrate within an inner volume of an inductively coupled etching apparatus. A portion of the substrate is overlaid by an inorganic material having a surface defined by regions that are substantially parallel to the inner volume and regions that are not parallel to the inner volume. The method also includes an operation for generating a high density plasma within the inner volume. The method further includes an operation for exposing the surface of the inorganic material to the high density plasma. Exposure of the inorganic material to the high density plasma causes a portion of the inorganic material to be removed in a substantially uniform manner from the regions that are substantially parallel to the inner volume and the regions that are not parallel to the inner volume.

In another embodiment, a method for controlling a hard mask trim process is disclosed. The method includes operations for generating a high density plasma and exposing the hard mask to the high density plasma. The hard mask is an inorganic material having a surface topography defined by regions that are substantially parallel to the high density plasma and regions that are not parallel to the high density plasma. The method further includes an operation for allowing the high density plasma to contact the hard mask to cause a portion of the hard mask to be etched. The method also includes an operation for controlling a bias voltage to adjust an amount of contact between the high density plasma and the regions of the surface topography that are not parallel to the high density plasma.

In another embodiment, an etching apparatus is disclosed. The etching apparatus includes a chamber having an internal volume capable of containing a high density plasma. An inlet is included for supplying a gas to the internal volume. The etching apparatus also includes an inductive power source capable of transforming the gas into the high density plasma within the internal volume. A substrate support configured to hold a substrate within the internal volume is also provided. The substrate is defined to have an inorganic material oriented to be exposed to the high density plasma to be contained within the internal volume.

In another embodiment, a semiconductor device is disclosed. The semiconductor device includes a substrate having a polysilicon feature disposed thereon. The polysilicon feature has a top surface substantially parallel to the substrate and a side surface substantially perpendicular to the substrate. A silicon oxide liner is conformally and directly disposed on both a portion of the substrate near the side surface of the polysilicon feature and on the side surface of the polysilicon feature. The silicon oxide liner is not disposed on the top surface of the polysilicon feature. Also, a silicon nitride layer is conformally and directly disposed on the silicon oxide liner.

In another embodiment, a method is disclosed for making a semiconductor device. The method includes defining a polysilicon feature on a substrate such that the polysilicon feature has a top surface substantially parallel to the substrate and side surfaces substantially perpendicular to the substrate. The method also includes an operation for defining a silicon oxide liner conformally and directly on the substrate and polysilicon feature. An operation is then performed to define a silicon nitride layer conformally and directly on the silicon oxide liner. An inorganic mask layer is then conformally and directly defined on the silicon nitride layer. The method further includes an operation for isotropically etching the inorganic mask layer to completely remove portions of the inorganic mask layer that conform to each of the top surface of the polysilicon feature and the substrate. The isotropical etching partially trims an amount of the inorganic mask layer that conforms to the side surfaces of the polysilicon feature so as to allow portions of the inorganic mask layer to remain conformal to the side surfaces of the polysilicon feature. The method also includes an operation for anisotropically etching the silicon nitride layer to completely remove portions of the silicon nitride layer that are not protected by the remaining portions of the inorganic mask layer. Portions of the silicon nitride layer underlying the remaining portions of the inorganic mask layer remain on each side of the polysilicon feature. Additionally, an operation is performed to strip the remaining portions of the inorganic mask layer and portions of the silicon oxide liner that are not protected by the remaining portions of the silicon nitride layer.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which:

FIG. 2C is an illustration showing a schematic of the feature resulting from an etching step performed to remove a portion of the silicon nitride during the formation of L-shaped spacers, in accordance with one embodiment of the present invention;

FIG. 2D is an illustration showing a schematic of the feature resulting from removal of the remaining silicon oxide and a portion of the silicon oxide liner following completion of the etching process to form L-shaped spacers, in accordance with one embodiment of the present invention;

DETAILED DESCRIPTION

Broadly speaking, methods and an apparatus are provided for removing an inorganic material from a substrate. More specifically, the present invention provides methods for removing the inorganic material from the substrate through exposure to a high density plasma generated using an inductively coupled etching apparatus. The high density plasma is set and controlled to isotropically contact particular regions of the inorganic material to allow for trimming and control of a critical dimension associated with the inorganic material.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
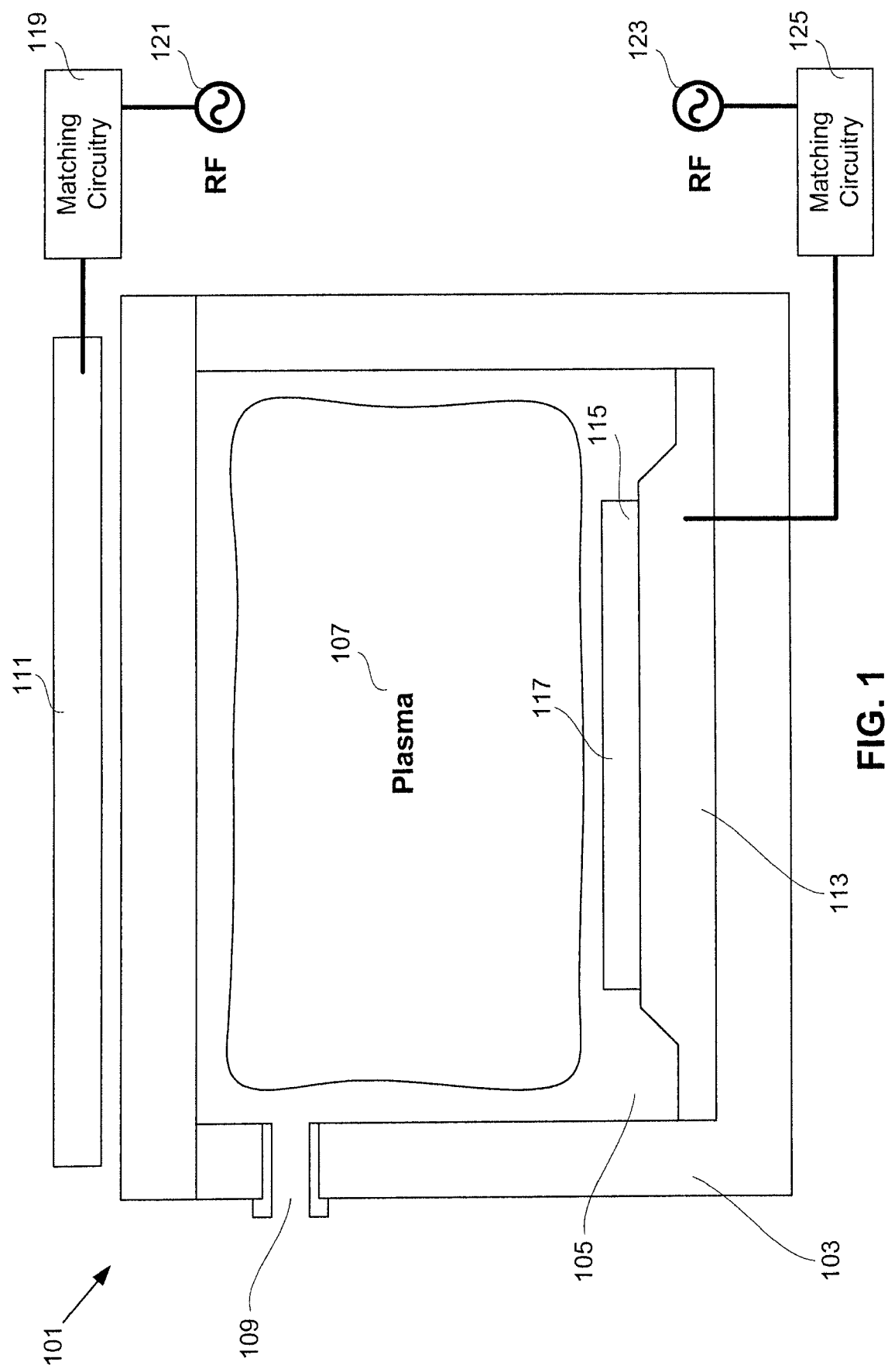
FIG. 1 is an illustration showing an inductively coupled etching apparatus, in accordance with one embodiment of the present invention.

FIG. 1 is an illustration showing an inductively coupled etching apparatus 101, in accordance with one embodiment of the present invention. The inductively coupled etching apparatus 101 includes a chamber 103 having an internal volume 105 defined by surrounding walls, a bottom, and a top. A substrate support structure 113 is located within the internal volume 105. In one embodiment, the substrate support structure 113 is an electrostatic chuck. The substrate support structure 113 can be connected to a bias power source 123 through matching circuitry 125. The substrate support structure 113 is configured to support a substrate 115 within the internal volume 105 of the chamber 103 during operation of the inductively coupled etching apparatus 101. In one embodiment, the substrate 115 represents a semiconductor wafer having an inorganic material 117 exposed to the internal volume 105 of the chamber 103. The inductively coupled etching apparatus 101 further includes an inductive power source 111 connected to a power supply 121 through matching circuitry 119. In one embodiment, the inductive power source 111 is represented by a coil. A gas inlet 109 is also provided to allow a reactant gas to flow into the internal volume 105 of the chamber 103. It should be appreciated by those skilled in the art that the gas inlet 109 is not limited to placement at a side of the chamber 103. The gas inlet 109 can be located at any other location around the chamber 103 that is compatible with other operating features of the inductively coupled etching apparatus 101.

During operation, the reactant gas is introduced into the internal volume 105 as high frequency power (i.e., RF power) is applied from the power supply 121 to the inductive power source 111 (e.g., coil). The applied high frequency power causes an RF current to flow through the inductive power source 111. The RF current flowing through the inductive power source 111 generates an electromagnetic field about the inductive power source 111. In following, the electromagnetic field generates an inductive current within the internal volume 105 of the chamber 103. The inductive current acts on the reactant gas to generate a plasma 107. In one embodiment, the inductive current is controlled to cause a substantial amount of the reactant gas to be converted to a high density plasma that is present in a substantially uniform amount throughout the internal volume 105 of the chamber 103. With a high density plasma, the surface of the substrate 115 exposed to the internal volume 105 will be exposed to the high density plasma in a substantially uniform manner. The term plasma 107 as used in the remainder of this document should be understood to mean high density plasma.

The plasma 107 contains various types of chemically reactive species, such as radicals and positive and negative ions. The chemical reactions of the various types of radicals and positive and negative ions are used to etch the surface of the substrate 115 that is exposed to the plasma 107. During the etching process, the inductive power source 111 performs a function analogous to that of a primary coil in a transformer, while the plasma 107 performs a function analogous to that of a secondary coil in the transformer.

It should be understood that while the present invention is described primarily in the context of the inductively coupled etching apparatus 101, the present invention can also be implemented using other plasma reactor configurations capable of generating a high density plasma. For example, in an alternate embodiment, an electron cyclotron resonance (ECR) device can be used to generate the high density plasma for performing the etching process.

A capability of the plasma 107 to etch a particular material is dependent on numerous factors, including a reactant gas type, a reactant gas flow rate, an internal volume 105 pressure, an amount of inductive power applied to the reactant gas, and a directionality of the plasma 107, among others. These factors can be optimized in order to effectively etch a particular material. Additionally, when different materials are simultaneously exposed to the plasma 107, and it is only desirable to etch a select number of the different materials, the numerous factors should be set such that the plasma 107 will etch the desired material while not adversely affecting the remaining materials. The ability of the plasma 107 to etch one material while not adversely affecting (e.g., etching) another material is called selectivity. The present invention provides a method for operating the inductively coupled etching apparatus 101 to etch the inorganic material 117 from the surface of the substrate 115 without adversely affecting other materials included on the substrate 115. The plasma 107 applied to etch the inorganic material 117 is the high density plasma being distributed in a substantially uniform manner throughout the internal volume 105 of the chamber 103, including over the surface of the substrate 115 that is exposed to the plasma 107.

In one embodiment, the present invention is implemented to form L-shaped spacers on either side of a feature that is present on the substrate. It should be understood, however, that the present invention is not limited to the application of forming L-shaped spacers. The present invention can be equally applied to other applications in which the inductively coupled etching apparatus is used to generate high density plasma for etching inorganic material from a substrate surface.

Figure 2A:
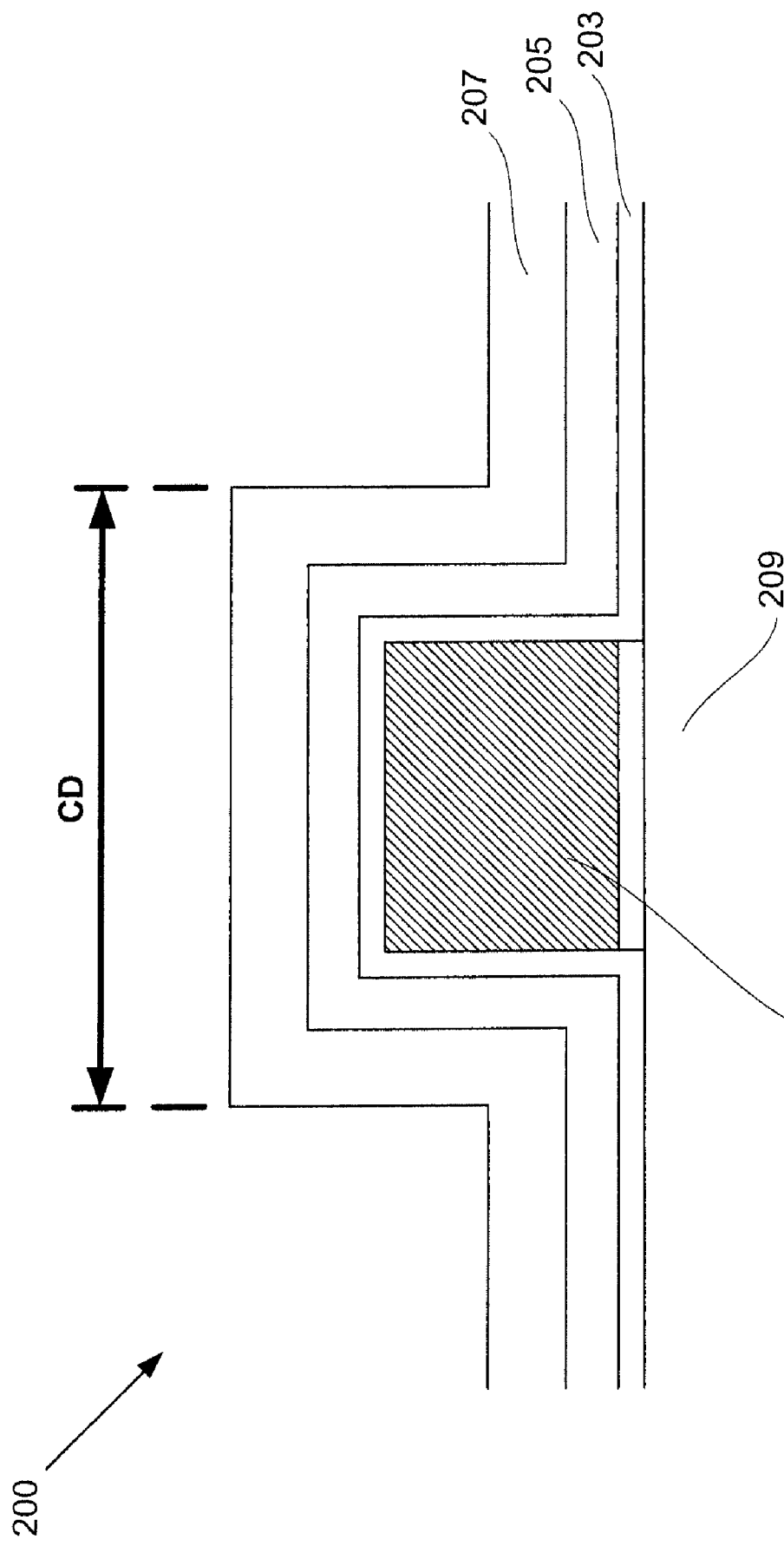
FIG. 2A is an illustration showing a schematic of a feature on a substrate prior to an etching process to form L-shaped spacers, in accordance with one embodiment of the present invention.

FIG. 2A is an illustration showing a schematic of a feature 200 on a substrate prior to an etching process to form L-shaped spacers, in accordance with one embodiment of the present invention. The feature 200 includes a number of stacked materials deposited over a substrate base 209. In one embodiment, the substrate base 209 is Si. However, it should be appreciated by those skilled in the art that the substrate base 209 can be represented by other materials or combinations of materials. The number of stacked materials includes a distinctly defined region of polysilicon 201. In one embodiment, the region of polysilicon 201 is defined to form a substantially rectangular shaped line on the substrate base 209. A silicon oxide ($SiO_2$) liner 203 is defined as a layer of material overlying both the region of polysilicon 201 and the substrate base 209 adjacent to the region of polysilicon 201. In one embodiment, the silicon oxide liner 203 is defined to have a substantially uniform thickness conforming to the contour formed by the region of polysilicon 201 on the substrate base 209. In the present example, the thickness of the silicon oxide liner 203 is about 100 angstroms (Å). As used herein, the term "about" means within ±10% of a specified value. A layer of silicon nitride ($Si_3N_4$) 205 is then deposited to overlie the silicon oxide liner 203. In one embodiment, the silicon nitride 205 is defined to have a substantially uniform thickness conforming to the contour formed by the silicon oxide liner 203. In the present example, the thickness of the silicon nitride 205 is about 200 Å. Another layer of silicon oxide 207 is then deposited to overlie the silicon nitride 205. In one embodiment, the silicon oxide 207 is defined to have a substantially uniform thickness conforming to the contour formed by the silicon nitride 205. In the present example, the thickness of the silicon oxide 207 is about 450 Å. A critical dimension (CD) of the feature 200 is defined as the largest distance across the feature 200 parallel to the underlying substrate base 209. With respect to FIG. 2A, the CD of the feature 200 extends from one side of the silicon oxide 207 to an opposite side of the silicon oxide 207.

As previously discussed, the etching process is dependent on numerous factors (e.g., reactant gas type, reactant gas flow rate, pressure, inductive power applied to the reactant gas, directionality of plasma, etc . . . ). A particular combination of settings for these numerous factors represents an etching recipe ("recipe"). An etching process may include a number of steps, with each step being performed with a different recipe tailored to provide a specific effect. For example, if it is desirable to remove a particular material in an etching step without significantly removing another material also exposed to the plasma, the recipe will be defined to provide a plasma setting that has a higher selectivity for removing the particular material and a lower selectivity for removing the other material.

Figure 2B:
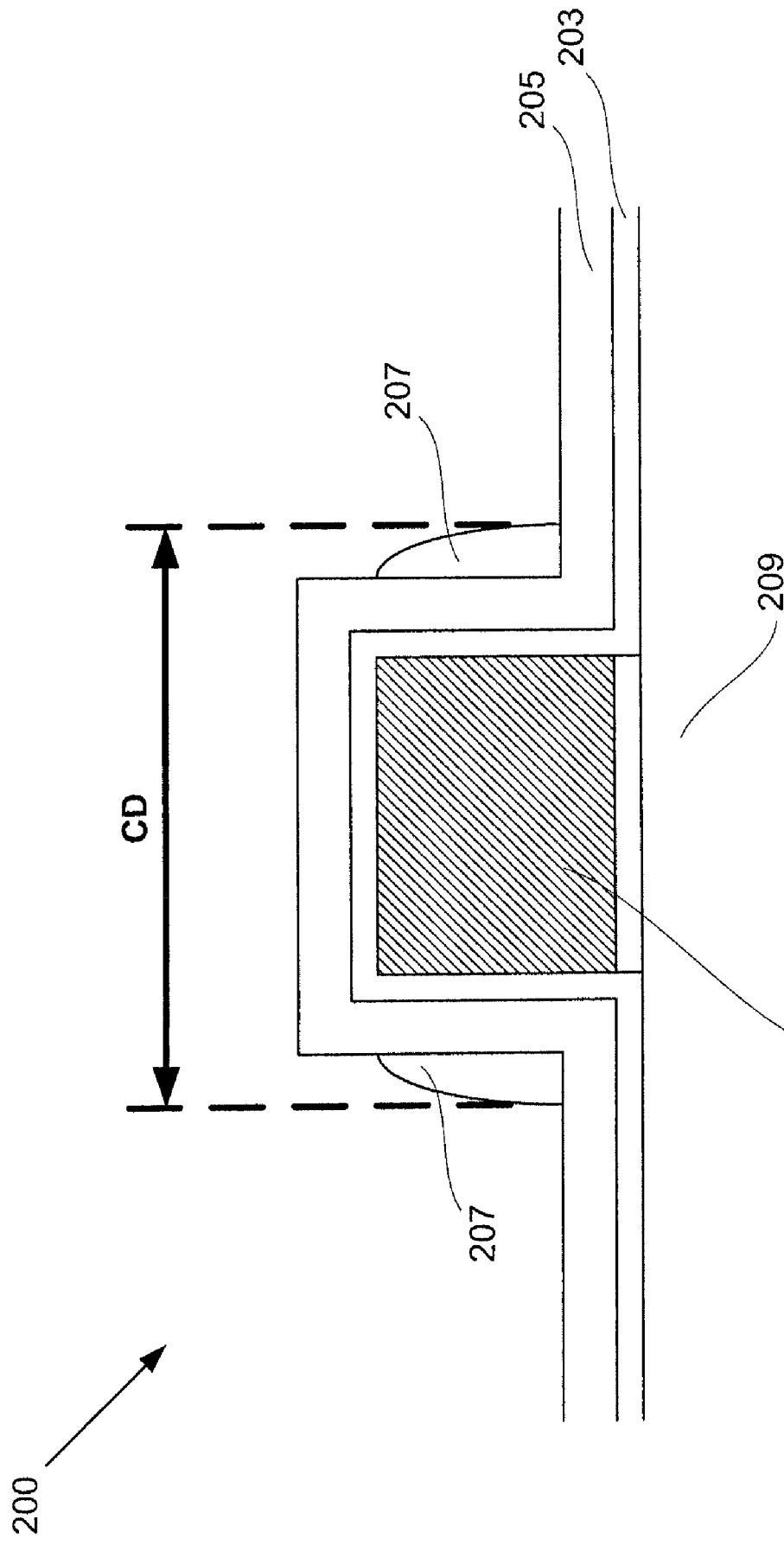
FIG. 2B is an illustration showing a schematic of the feature resulting from an etching step performed to remove and trim portions of the silicon oxide during the formation of L-shaped spacers, in accordance with one embodiment of the present invention.

FIG. 2B is an illustration showing a schematic of the feature 200 resulting from an etching step performed to remove and trim portions of the silicon oxide 207 during the formation of L-shaped spacers, in accordance with one embodiment of the present invention. The etching step uses a recipe to remove the silicon oxide 207 from regions that are both substantially parallel to the plasma 107 and regions that are not parallel to the plasma 107. Since the substrate base 209 is substantially parallel to the plasma 107, the regions being substantially parallel to the plasma 107 can also be referenced as being substantially parallel to the substrate base 209. Removal of the silicon oxide 207 from regions that are not parallel to either the plasma 107 or the underlying substrate base 209 is referred to as trimming. Trimming directly effects the CD of the feature 200. As the silicon oxide 207 is trimmed the CD is reduced.

With respect to FIG. 2B, it can be seen that the etching step removes essentially all of the silicon oxide 207 from the region of the feature that is substantially parallel to the plasma 107. The etching step also partially removes (i.e., trims) the silicon oxide 207 that is not parallel to the plasma 107. The silicon oxide 207 remaining after the etching step serves as a mask for protecting a portion of the silicon nitride 205 during a subsequent etching step designed to remove silicon nitride 205.

In one embodiment, the plasma 107 can be directionally biased to preferentially contact the regions that are substantially parallel to the plasma 107. This directional bias can be implemented by applying a bias power to the substrate support structure 113. The bias power serves to pull the plasma 107 toward the substrate support structure 113. In another embodiment, however, the plasma 107 can be allowed to isotropically (i.e., uniformly in direction) contact both the regions that are substantially parallel to the plasma 107 and the regions that are not parallel to the plasma 107. Isotropic contact between the plasma 107 and each surface region defining a topography of the feature 200 can be implemented by minimizing or eliminating the bias power used to pull the plasma 107 toward the substrate support structure 113. In the present invention, isotropic contact between the regions that are not parallel to the plasma 107 is exploited to enhance trimming of the silicon oxide 207 with a corresponding reduction in the CD of the feature 200. Thus, with the present invention, trimming can be independently controlled. Reducing and controlling the CD of a feature can be beneficial, particularly when minimization of space between features is important.

FIG. 2C is an illustration showing a schematic of the feature 200 resulting from an etching step performed to remove a portion of the silicon nitride 205 during the formation of L-shaped spacers, in accordance with one embodiment of the present invention. In one embodiment, the etching step directionally biases the plasma toward the substrate support structure 113 to preferentially and rapidly remove the silicon nitride 205 from regions that are substantially parallel to the plasma 107. The trimmed silicon oxide 207 remaining after the etching step to remove the silicon oxide 207 serves as a mask to protect a bottom part of the L-shaped silicon nitride 205 from being etched. The etching step to remove portions of the silicon nitride 205 serves to form the silicon nitride 205 component of the L-shaped spacers. It should be noted that the CD of the feature 200 after trimming of the silicon oxide 207 also defines the CD after removal of the silicon nitride 205. Thus, the trimming of the silicon oxide 207 in the previously discussed etching step directly defines the CD of the feature 205 after formation of the spacers is completed. Once the silicon nitride 205 etching is completed, the silicon oxide 207 and a portion of the silicon oxide liner 203 is removed.

FIG. 2D is an illustration showing a schematic of the feature 200 resulting from removal of the remaining silicon oxide 207 and a portion of the silicon oxide liner 203 following completion of the etching process to form L-shaped spacers, in accordance with one embodiment of the present invention. In various embodiments, one or more stripping operations are performed to remove the remaining silicon oxide 207 and portions of the silicon oxide liner 203 that are not disposed between the silicon nitride 205 and the polysilicon 201. The stripping operations can be performed using a number of methods. In one embodiment, two steps are used for the stripping operation. A first strip step utilizes an oxygen plasma strip to remove organic polymers that are side-products of the etching process. The oxygen plasma strip can be performed using a high density plasma reactor or another type of plasma asher. A second strip step is performed as a wet strip using hydrofluoric acid (HF) to remove silicon oxide. Again, it should be noted that the CD of the feature 200 after trimming of the silicon oxide 207 defines the final CD of the feature upon completion of the L-shaped spacer formation.

Figure 3:
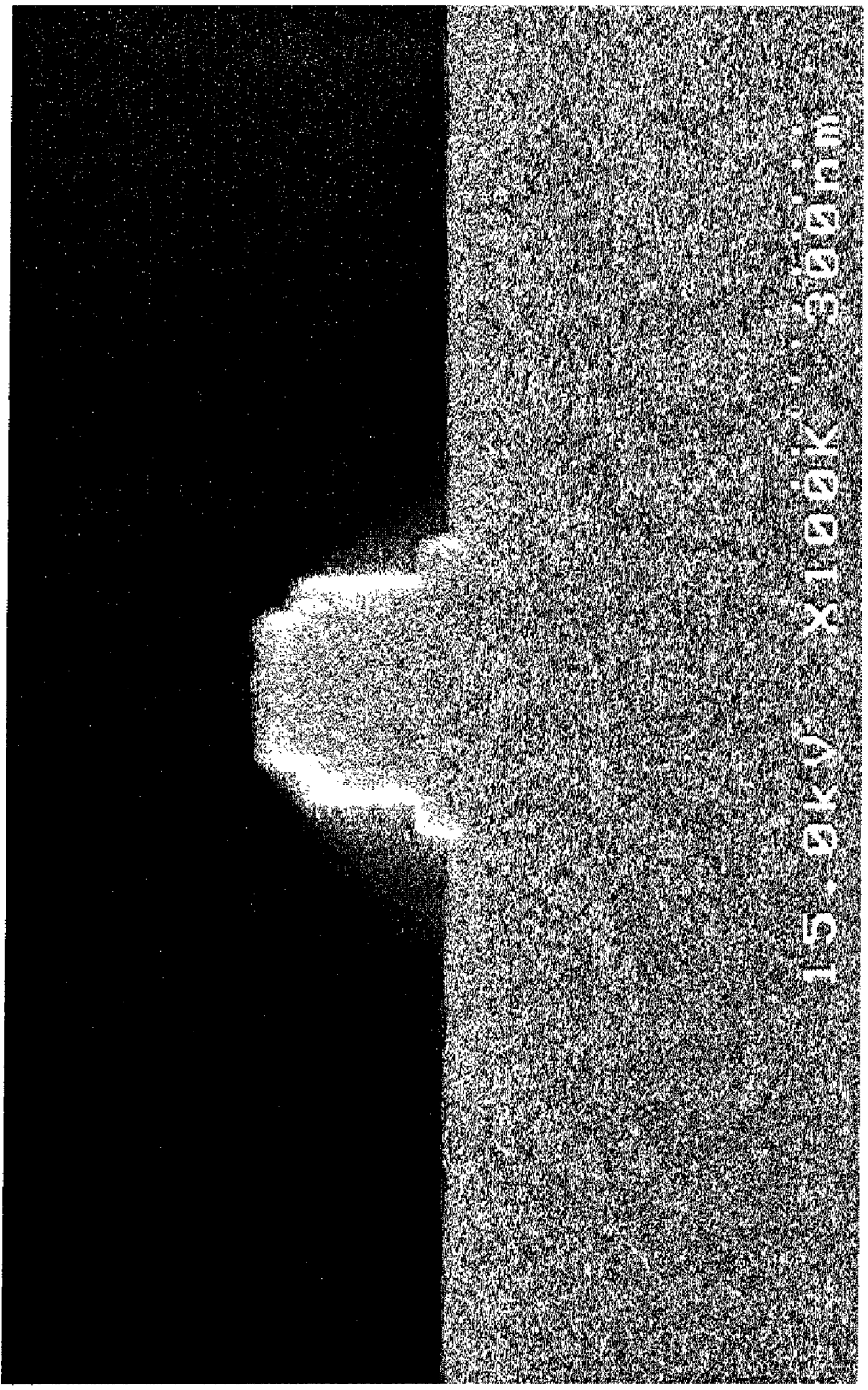
FIG. 3 is an illustration showing a scanning electron microscope (SEM) image of the feature resulting from performance of the etching process as presented in Table 1.

Table 1 shows exemplary settings for various recipe parameters to be used in the etching process to form L-shaped spacers. The etching process includes a number of etching steps. A step 1a is provided for removing and trimming the silicon oxide 207 as previously described. A step 1b is provided as an over-etch step to ensure that essentially all of the silicon oxide 207 is removed from appropriate portions of the feature 200. In this instance, the appropriate portions of the feature 200 are those portions where silicon oxide 207 material is not required to serve as a mask during etching of the silicon nitride 205. A step 2 is then provided for removing the silicon nitride 205 that is not protected by the mask representing the remaining silicon oxide 207. A step 3 is provided as an over-etch step to ensure that essentially all of the appropriate silicon nitride 205 is removed. A step 4 is also provided for stripping etch side-product organic polymers from the substrate surface. In a step 5, a separate HF wet strip process is provided for removing the remaining silicon oxide 207 and silicon oxide liner 203 that is not protected by the remaining silicon nitride 205. FIG. 3 is an illustration showing a scanning electron microscope (SEM) image of the feature 200 resulting from performance of the etching process as presented in Table 1.

The recipe parameters for each etching step are defined to provide the appropriate material selectivity during the respective etching step. Steps 1a and 1b provide an oxide-to-nitride material removal selectivity of about 1.5 to 1. Due to the relatively low oxide-to-nitride material removal selectivity, the duration of step 1b is a small percentage of the step 1a duration. In one embodiment, the step 1b duration is about 10% of the step 1a duration. Also, the step 1b duration can be adjusted to finely control the critical dimension of the feature. Step 2 provides a nitride-to-oxide material removal selectivity of about 1.9 to 1. Step 3 provides a nitride-to-oxide material removal selectivity of about 7.2 to 1. Due to the relatively high nitride-to-oxide material removal selectivity, the duration of step 3 can be more easily extended without causing unacceptable removal of oxide material. It should be understood, however, that variations in the recipe parameter settings may affect the resulting material removal selectivity for each step.

The specific values presented in Table 1 are provided for exemplary purposes. Other values within appropriate ranges can also be used for setting the various recipe parameters. In one embodiment, the pressure for steps 1a and 1b is controlled within a range extending from about 5 milliTorr (mT) to about 60 mT. In another embodiment, the pressure for steps 1a and 1b is controlled within a range extending from about 20 mT to about 40 mT. In one embodiment, the inductive power for steps 1a and 1b is controlled within a range increasing from about 400 W. In one embodiment, the bias voltage for steps 1a and 1b is minimized within a range extending from zero to about 50 W. In one embodiment, the $CF_4$ reactant gas flow rate for steps 1a and 1b is controlled within a range extending from about 50 standard cubic centimeters per minute (sccm) to about 300 sccm. In another embodiment, the $CF_4$ reactant gas flow rate for steps 1a and 1b is controlled within a range extending from about 100 sccm to about 250 sccm. In one embodiment, the substrate temperature is controlled within a range extending from about 0 C to about 70 C. In another embodiment, the substrate temperature is controlled within a range extending from about 10 C to about 30 C.

TABLE 1

Recipe for L-Shaped Spacer Etching Process

| | Step Number | | | | | |
|---|---|---|---|---|---|---|
| | 1a | 1b | 2 | 3 | 4 | 5 |
| Step Description | Silicon Oxide 207 Etch/Trim | Silicon Oxide 207 Over-Etch/Trim | Silicon Nitride 205 Etch | Silicon Nitride 205 Over-Etch | Organic Polymer Strip | Silicon Oxide 207 & Silicon Oxide Liner 203 HF Wet Strip |
| Internal Volume Pressure (mT) | 30 | 30 | 10 | 10 | 50 | Not Applicable (n/a) |
| Inductive Power (W) | 1000 | 1000 | 170 | 500 | 1000 | n/a |
| Bias Power (yes/no) | no | no | yes | yes | no | n/a |
| $CH_3F$ (sccm) | — | — | — | 60 | — | n/a |
| $CH_2F_2$ (sccm) | — | — | 20 | — | — | n/a |
| $CF_4$ (sccm) | 180 | 180 | 50 | — | — | n/a |
| $O_2$ (sccm) | — | — | 30 | — | 200 | n/a |
| Substrate Temperature (C.) | 20 | 20 | 20 | 20 | 20 | n/a |

Figure 4:
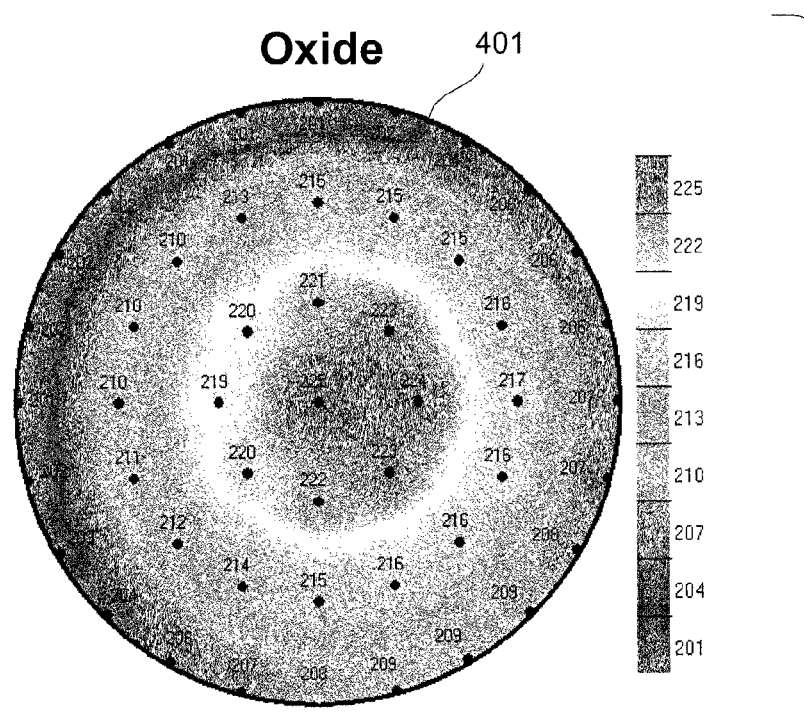
FIG. 4 is an illustration showing oxide and nitride material removal rates resulting from performance of steps 1a and 1b in the etching process presented in Table 1.
Figure 4:
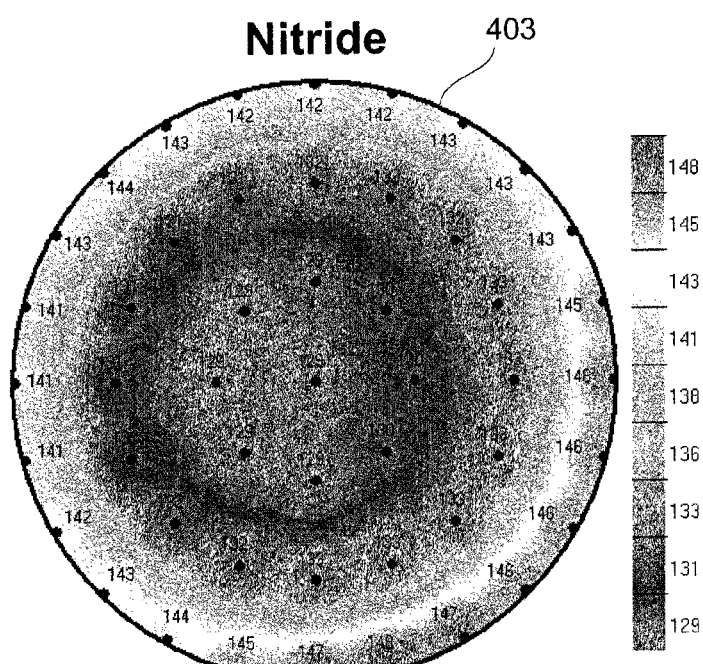

FIG. 4 is an illustration showing oxide and nitride material removal rates resulting from performance of steps 1a and 1b in the etching process presented in Table 1. Circular images 401 and 403 represent top views of the surface of the substrate 115. Numerical values presented on circular images 401 and 403 correspond to oxide and nitride material removal rates, respectively, during performance of steps 1a and 1b. The material removal rates are presented in units of Å per minute. A mean value and a three standard deviation (3-sigma) value corresponding to each of the presented material removal rate data sets is also presented below their respective data set. The previously mentioned oxide-to-nitride material removal selectivity of about 1.5 to 1 can be obtained by dividing the mean oxide material removal rate (211Å/min) by the mean nitride material removal rate (137 Å/min). Also, the appreciably low 3-sigma values illustrate the material removal rate uniformity that is achieved across the surface of the substrate 115, through exposure to the high density plasma as afforded by use of the inductively coupled etching apparatus.

Figure 5:
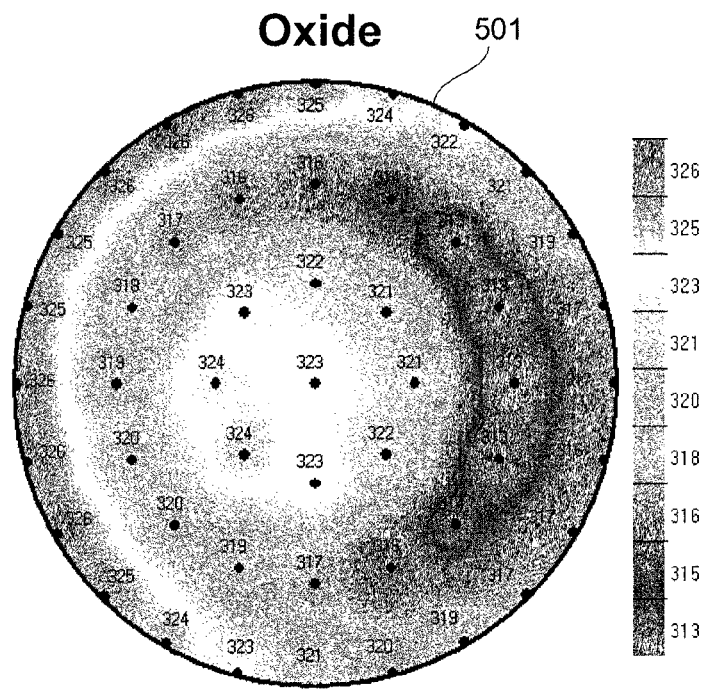
FIG. 5 is an illustration showing oxide and nitride material removal rates resulting from performance of step 2 in the etching process presented in Table 1.
Figure 5:
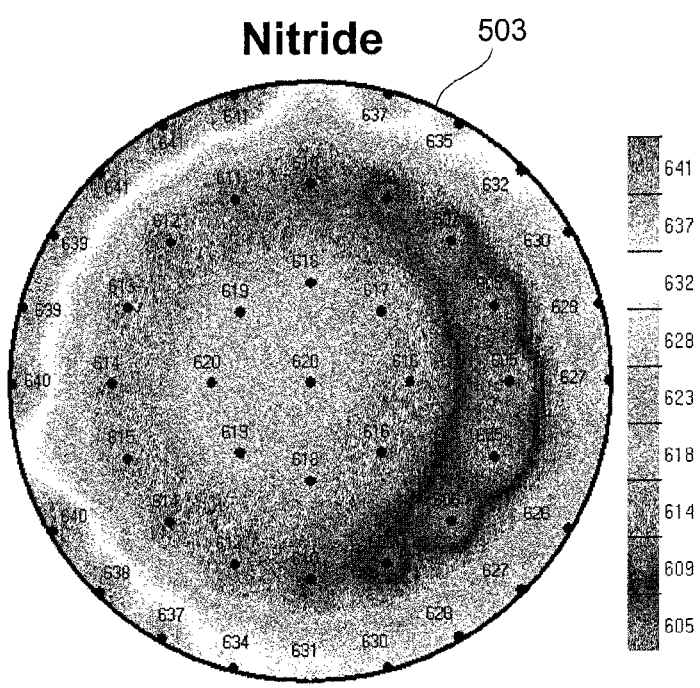

FIG. 5 is an illustration showing oxide and nitride material removal rates resulting from performance of step 2 in the etching process presented in Table 1. Circular images 501 and 503 represent top views of the surface of the substrate 115. Numerical values presented on circular images 501 and 503 correspond to oxide and nitride material removal rates, respectively, during performance of step 2. A mean value and a 3-sigma value corresponding to each of the presented material removal rate data sets is also presented below their respective data set. The previously mentioned nitride-to-oxide material removal selectivity of about 1.9 to 1 can be obtained by dividing the mean nitride material removal rate (623 Å/min) by the mean oxide material removal rate (320 Å/min). As with steps 1a and 1b, the appreciably low 3-sigma values corresponding to step 2 illustrate the material removal rate uniformity that is achieved across the surface of the substrate 115. Again, exposure to the high density plasma as afforded by use of the inductively coupled etching apparatus provides the substantial material removal rate uniformity.

Figure 6:
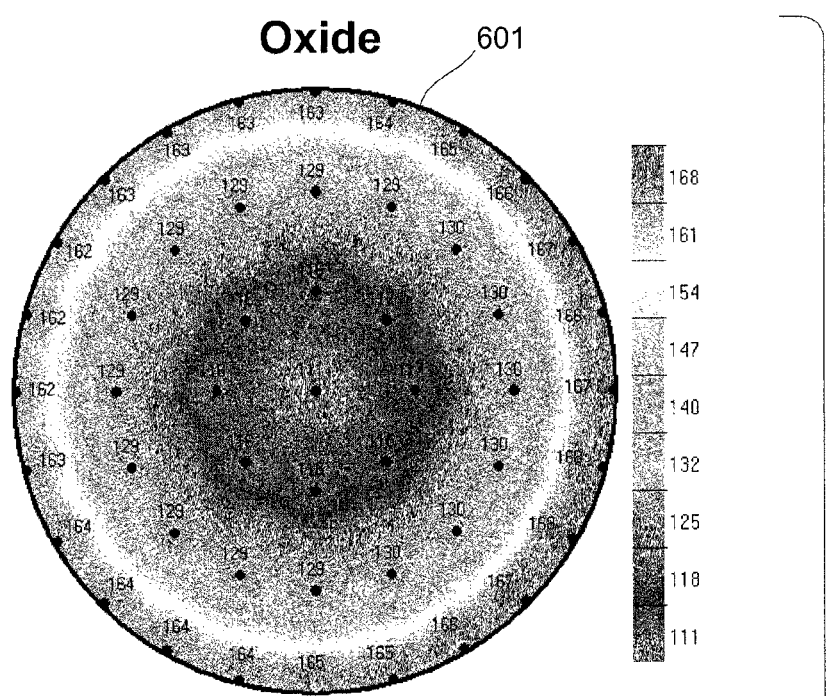
FIG. 6 is an illustration showing oxide and nitride material removal rates resulting from performance of step 3 in the etching process presented in Table 1.
Figure 6:
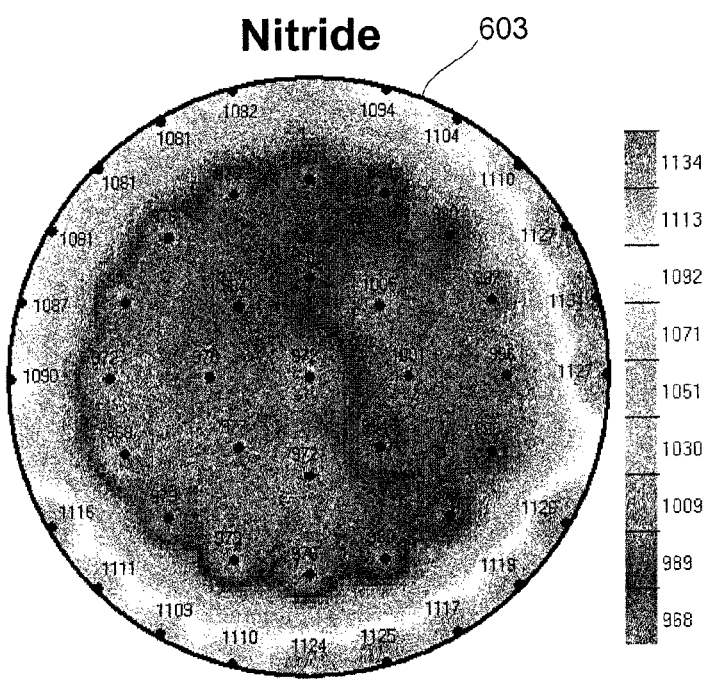

FIG. 6 is an illustration showing oxide and nitride material removal rates resulting from performance of step 3 in the etching process presented in Table 1. Circular images 601 and 603 represent top views of the surface of the substrate 115. Numerical values presented on circular images 601 and 603 correspond to oxide and nitride material removal rates, respectively, during performance of step 3. A mean value and a 3-sigma value corresponding to each of the presented material removal rate data sets is also presented below their respective data set. The previously mentioned nitride-to-oxide material removal selectivity of about 7.2 to 1 can be obtained by dividing the mean nitride material removal rate (1040 Å/min) by the mean oxide material removal rate (144 Å/min). As with steps 1a, 1b, and 2, the appreciably low 3-sigma value corresponding to the nitride material removal rate of step 3 illustrates the material removal rate uniformity that is achieved across the surface of the substrate 115.

Figure 7:
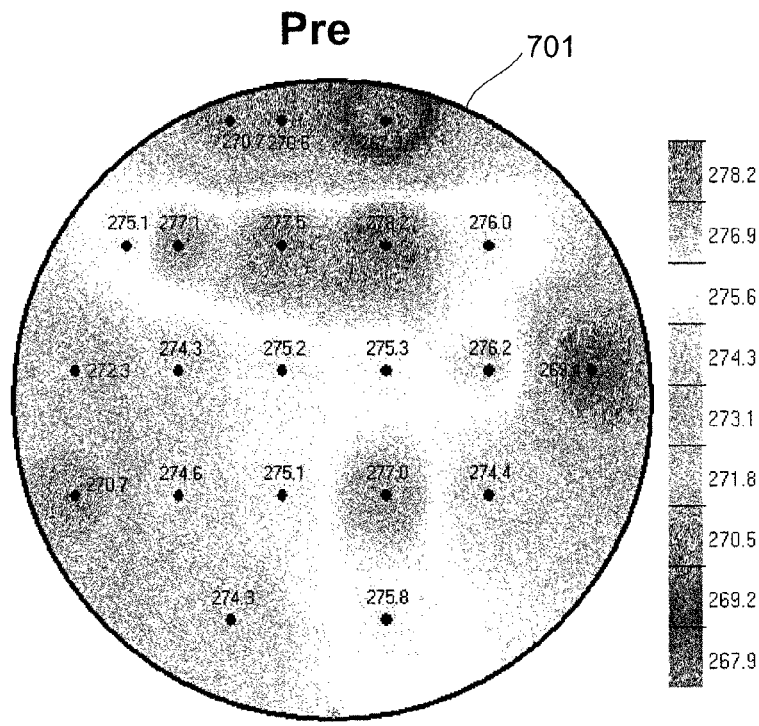
FIG. 7 is an illustration showing critical dimension (CD) measurements before ("Pre") and after ("Post") performance of the etching process presented in Table 1.
Figure 7:
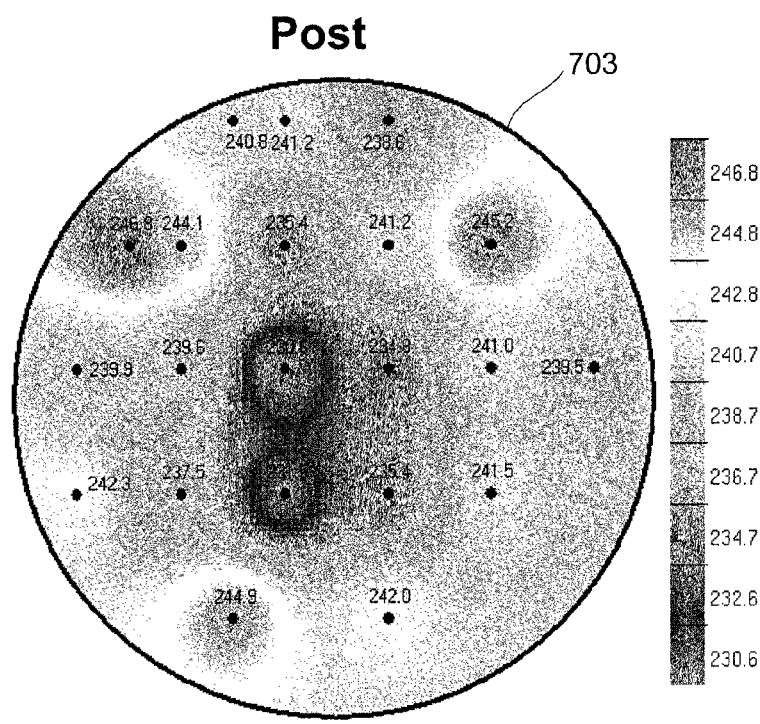

FIG. 7 is an illustration showing critical dimension (CD) measurements before ("Pre") and after ("Post") performance of the etching process presented in Table 1. The CD measurement before the etching process corresponds to the CD dimension previously discussed with respect to FIG. 2A. The CD measurement after the etching process corresponds to the CD dimension previously discussed with respect to FIG. 2D. Circular images 701 and 703 represent top views of the surface of the substrate 115. Numerical values presented on circular images 701 and 703 correspond to CD measurements taken before and after, respectively, performance of the etching process presented in Table 1. A mean value, a 3-sigma value, and a range value corresponding to each of the presented CD measurement data sets is also presented below their respective data set. Comparison of the mean CD measurements before (274.2 nm) and after (239.7 nm) the etching process demonstrate that the etching process serves to reduce the CD. As previously stated, reducing and controlling the CD of a feature can be beneficial, particularly when minimization of space between features is important. The appreciably low 3-sigma value and range value existing after performance of the etching process illustrates the CD uniformity that is achieved through exposure to the substantially uniform high density plasma.

Figure 8:
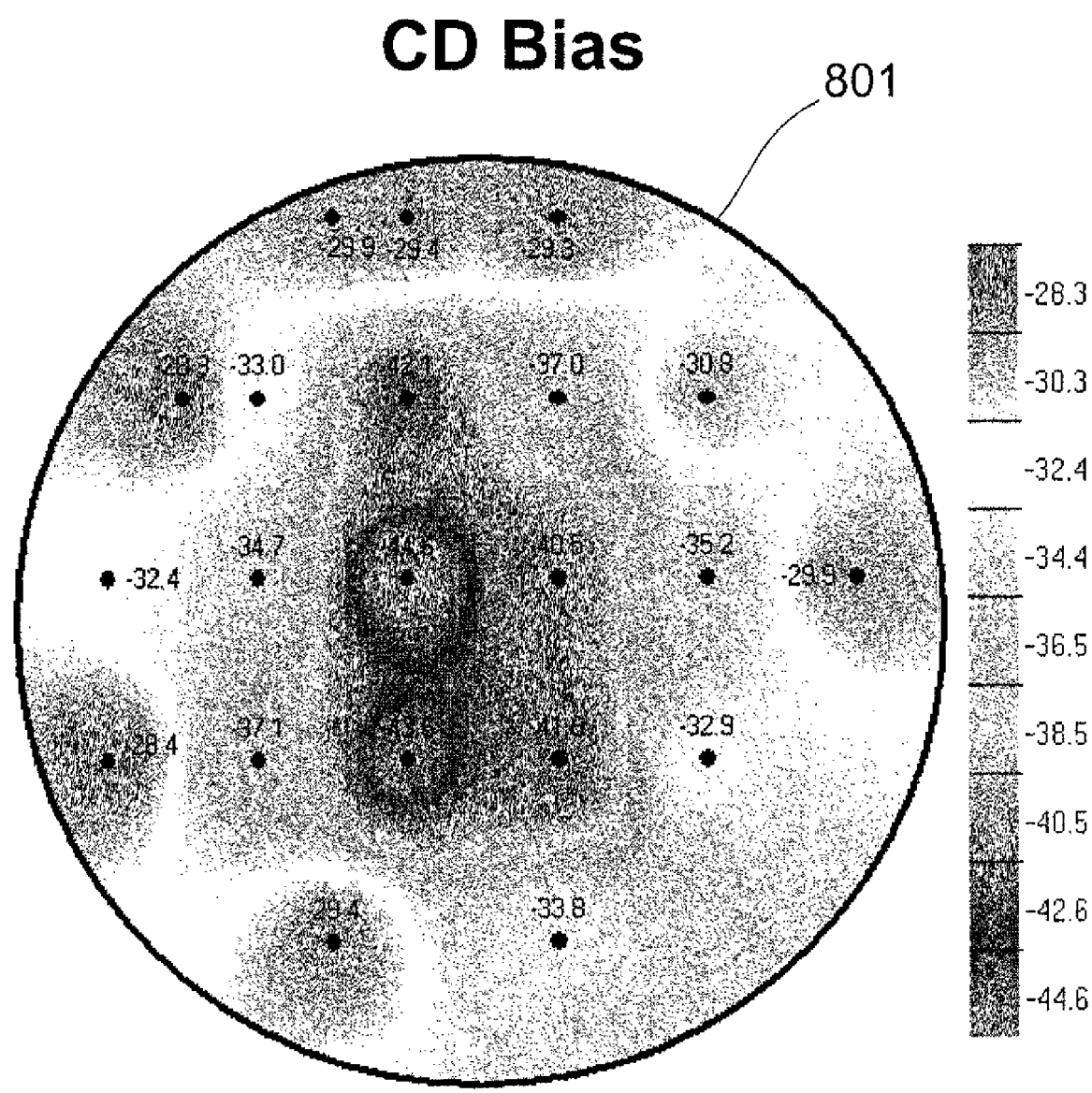
FIG. 8 is an illustration showing CD bias values resulting from performance of the etching process presented in Table 1.

FIG. 8 is an illustration showing CD bias values resulting from performance of the etching process presented in Table 1. A CD bias value is determined by subtracting the CD value before the etching process from the CD value after the etching process. A circular image 801 represents the top view of the surface of the substrate 115 as previously shown in circular images 701 and 703 of FIG. 7. Numerical values presented on circular image 801 correspond to CD bias values determined from the CD measurements shown in circular images 701 and 703. More specifically, each numerical value shown in circular image 801 represents the result obtained by subtracting the corresponding CD measurement before the etching process (obtained from circular image 701) from the corresponding CD measurement after the etching process (obtained from circular image 703). A mean value, a 3-sigma value, and a range value corresponding to the CD bias value data set is also presented.

Figure 9:
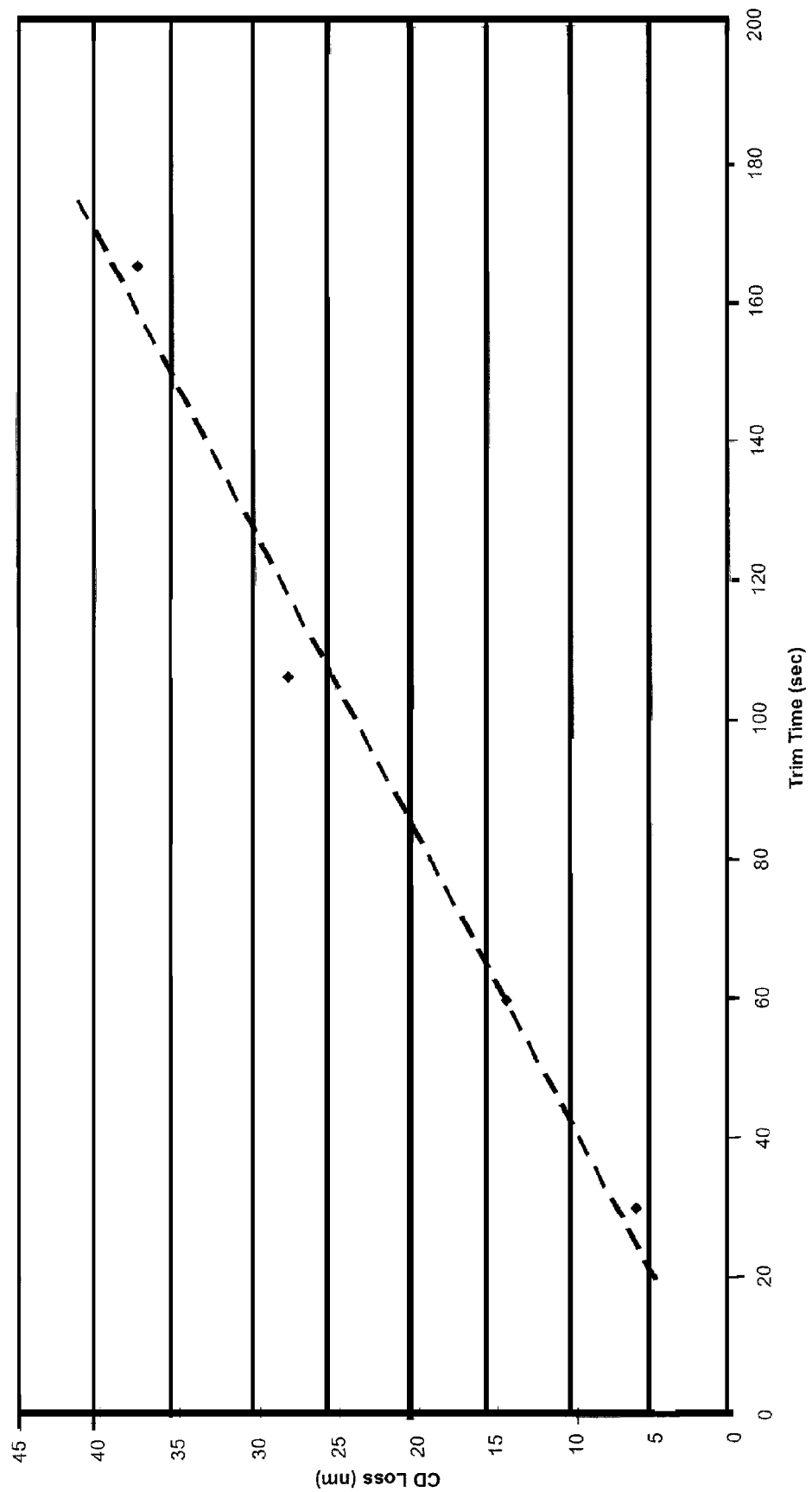
FIG. 9 is an illustration showing a relationship between CD loss and trim time as determined during performance of the etching process presented in Table 1.

The silicon oxide 207 trimming that occurs during steps 1a and 1b of the etching process presented in Table 1 serves to define the final CD of the feature 200. In order to gauge an appropriate duration for each of steps 1a and 1b, it is necessary to understand how CD reduction (i.e., loss) relates and trim time. FIG. 9 is an illustration showing a relationship between CD loss and trim time as determined during performance of the etching process presented in Table 1. The CD loss is shown to be substantially linear with respect to trim time. The relationship shown in FIG. 9, may be used to determine an appropriate duration for the silicon oxide 207 etch and trim steps (i.e., steps 1a and 1b) to obtain a desired final CD of the feature 200. Establishing the duration for the silicon oxide 207 etch and trim steps also involves consideration of the prevailing material removal selectivity and the time required to cause each type of material to become substantially exposed to the high density plasma.

Figure 10:
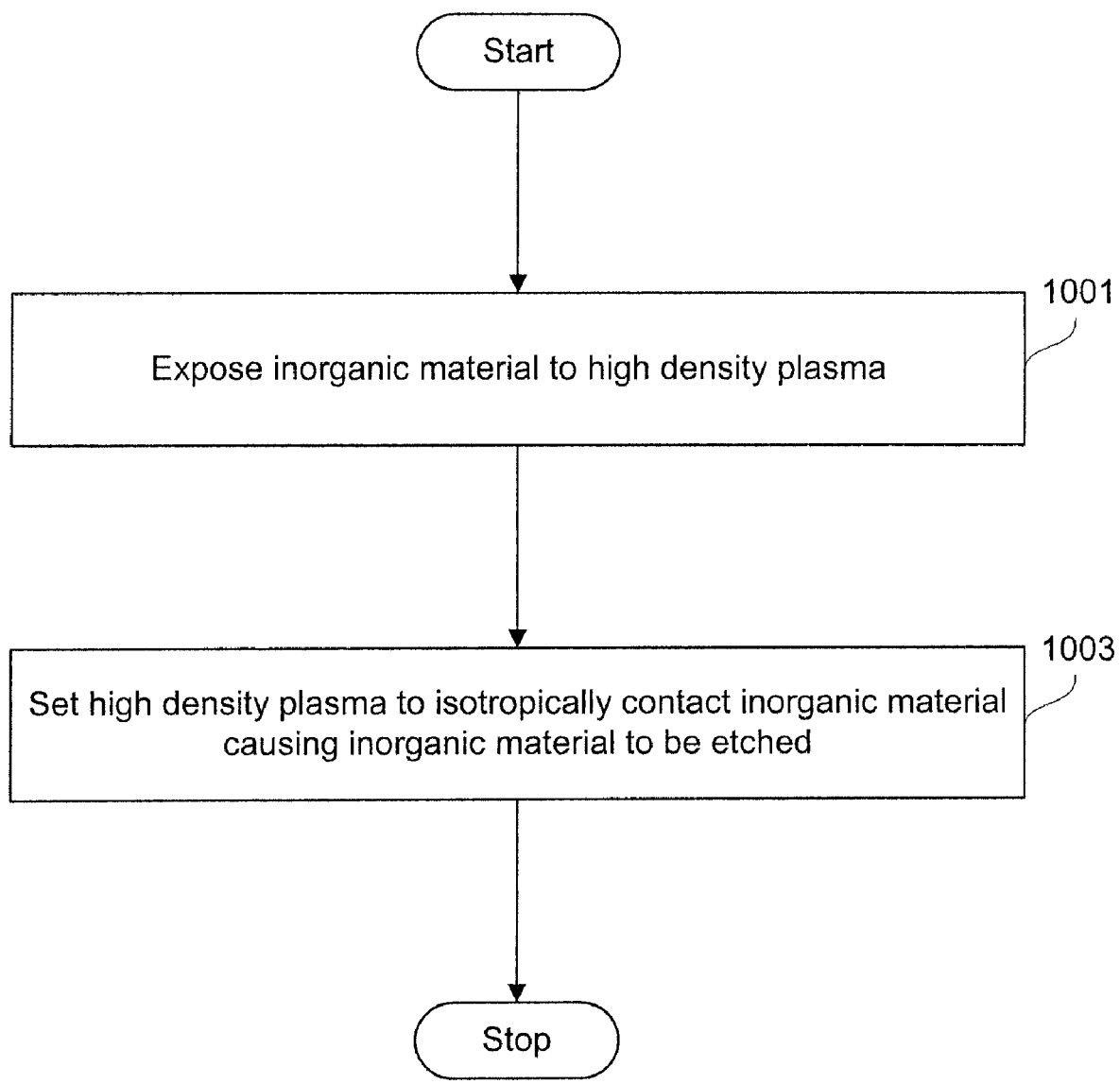
FIG. 10 is an illustration showing a flowchart of a method for etching, in accordance with one embodiment of the present invention.

FIG. 10 is an illustration showing a flowchart of a method for etching, in accordance with one embodiment of the present invention. The method includes an operation 1001 for exposing an inorganic material to a high density plasma. A surface of the inorganic material exposed to the high density plasma is defined by regions having different orientations with respect to a source of the high density plasma. Some regions of the inorganic material are substantially parallel to the source of the high density plasma. Other regions are not parallel to the source of the high density plasma. The high density plasma is distributed across the inorganic material in a substantially uniform manner.

In one embodiment, the inorganic material overlays a substrate. For example, the substrate may be represented by one or more materials defining a semiconductor wafer. In this embodiment, the inorganic material may represent a hard mask. In various embodiments, the inorganic material may be one of $SiO_2$, $Si_3N_4$, and SiON. However, the inorganic material included in the present method is not limited to these materials. For example, the inorganic material may be another oxide or nitride compound.

The method further includes an operation 1003 for setting the high density plasma to isotropically contact the inorganic material. Contact between the high density plasma and the inorganic material causes the inorganic material to be etched or removed. The isotropic contact between the high density plasma and the inorganic material occurs within both the regions that are substantially parallel to the source of the high density plasma and the regions that are not parallel to the source of the high density plasma. The isotropic contact causes a substantially uniform amount of the inorganic material to be etched from both the regions that are substantially parallel to the source of the high density plasma and the regions that are not parallel to the source of the high density plasma. In one embodiment, the setting of the high density plasma can be adjusted to cause preferential etching of a particular region of the surface of the inorganic material. For example, the high density plasma can be set to preferentially etch the regions that are substantially parallel to the source of the high density plasma or the regions that are not parallel to the source of the high density plasma.

Figure 11:
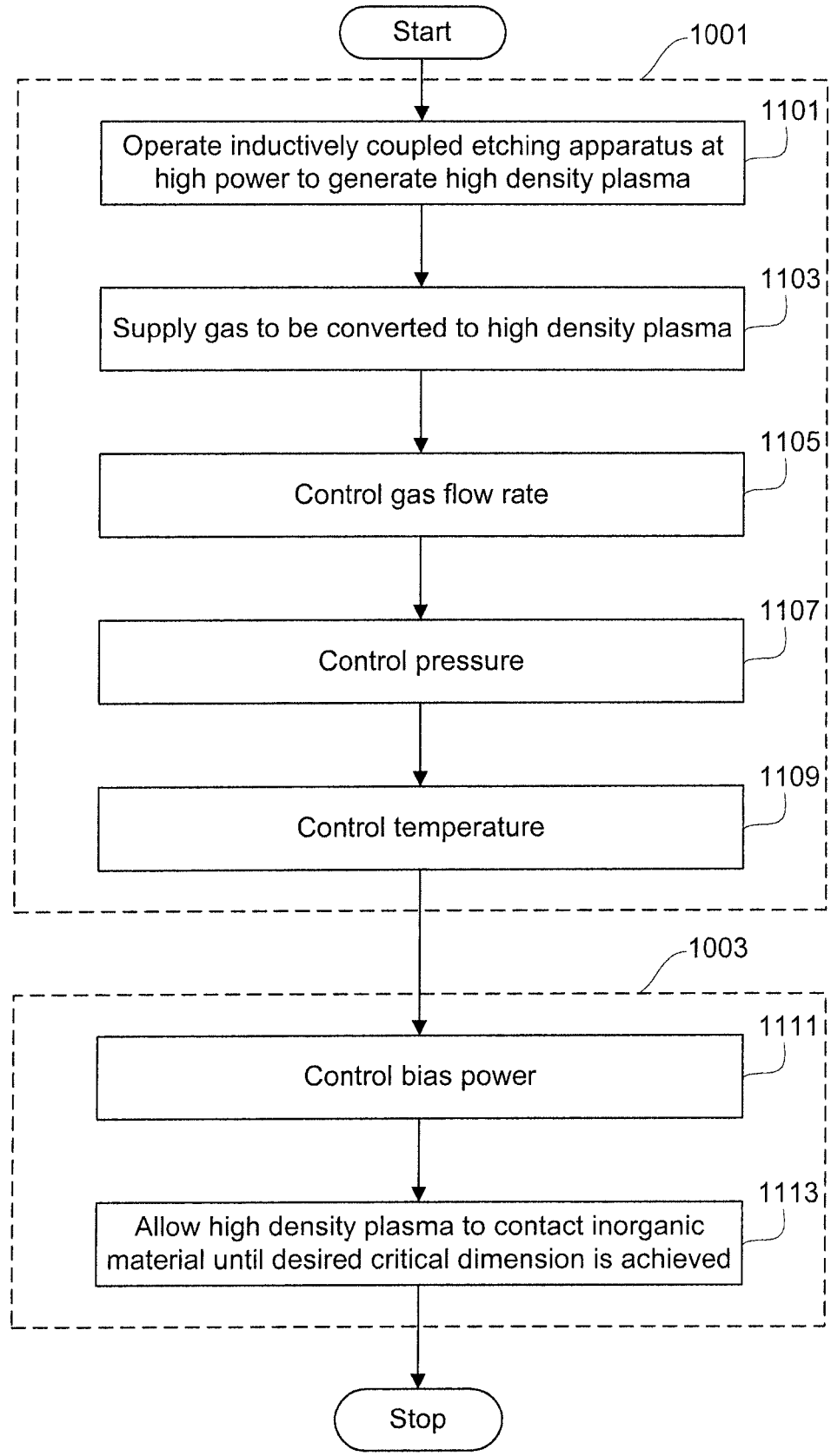
FIG. 11 is an illustration showing an expanded flowchart of the method for etching as discussed with respect to FIG. 10, in accordance with one embodiment of the present invention.

FIG. 11 is an illustration showing an expanded flowchart of the method for etching as discussed with respect to FIG. 10, in accordance with one embodiment of the present invention. The operation 1001 for exposing the inorganic material to the high density plasma can include a number of operations. In an operation 1101, an inductively coupled etching apparatus is operated at high power to generate the high density plasma. The high density plasma is generated within an inner volume of the inductively coupled etching apparatus. The high power is controlled within a range greater than about 400 Watts. In one embodiment, the high power is controlled at about 1000 Watts. In an operation 1103, a gas is supplied to the inner volume of the inductively coupled etching apparatus. The gas is converted to the high density plasma through application of the high power to the gas during operation of the inductively coupled etching apparatus. In one embodiment, the gas is either $CF_4$, $C_2F_6$, anhydrous HF, and $SF_6$. However, the present method is not limited to these gases. Other gases capable of being converted to a high density plasma for etching inorganic materials can also be used with the present method. An operation 1105 is provided for controlling the gas flow rate through the inner volume of the inductively coupled etching apparatus. In one embodiment, the gas flow rate is controlled within a range extending from about 50 sccm to about 300 sccm. In another embodiment, the gas flow rate is controlled within a range extending from about 100 sccm to about 250 sccm. In yet another embodiment, the gas flow rate is controlled at about 180 sccm. An operation 1107 is also provided for controlling a pressure within the inner volume of the inductively coupled etching apparatus. In one embodiment, the pressure is controlled within a range extending from about 5 mT to about 60 mT. In another embodiment, the pressure is controlled within a range extending from about 20 mT to about 40 mT. In yet another embodiment, the pressure is controlled at about 30 mT. Additionally, in an operation 1109 a temperature of the substrate is controlled. In one embodiment, the temperature of the substrate is controlled within a range extending from about 0 C to about 70 C In another embodiment, the temperature of the substrate is controlled within a range extending from about 10 C to about 30 C. In yet another embodiment, the temperature of the substrate is controlled at about 20 C.

The operation 1003 for setting the high density plasma to isotropically contact the inorganic material can also include a number of operations. In an operation 1111, a bias power is controlled to affect an amount of contact between the high density plasma and the inorganic material. In one embodiment, the bias power is controlled to affect the amount of contact between the high density plasma and the regions of the inorganic material surface that are not parallel to the source of the high density plasma. For example, if the bias power is controlled to be increased, the increased bias power will cause a reduction in the amount of contact between the high density plasma and the regions of the inorganic material surface that are not parallel to the source of the high density plasma. Conversely, for example, if the bias power is controlled to be decreased, the decreased bias power will cause an increase in the amount of contact between the high density plasma and the regions of the inorganic material surface that are not parallel to the source of the high density plasma. In one embodiment, the bias power is controlled within a range extending from zero to about 50 Watts to ensure that an adequate amount of contact is achieved between the high density plasma and the regions of the inorganic material surface that are not parallel to the source of the high density plasma. The method further includes an operation 1113 for allowing the high density plasma to contact the surface of the inorganic material until a desired critical dimension is achieved. In one embodiment, the critical dimension can be a line width of a feature defined on a semiconductor wafer.

Figure 12:
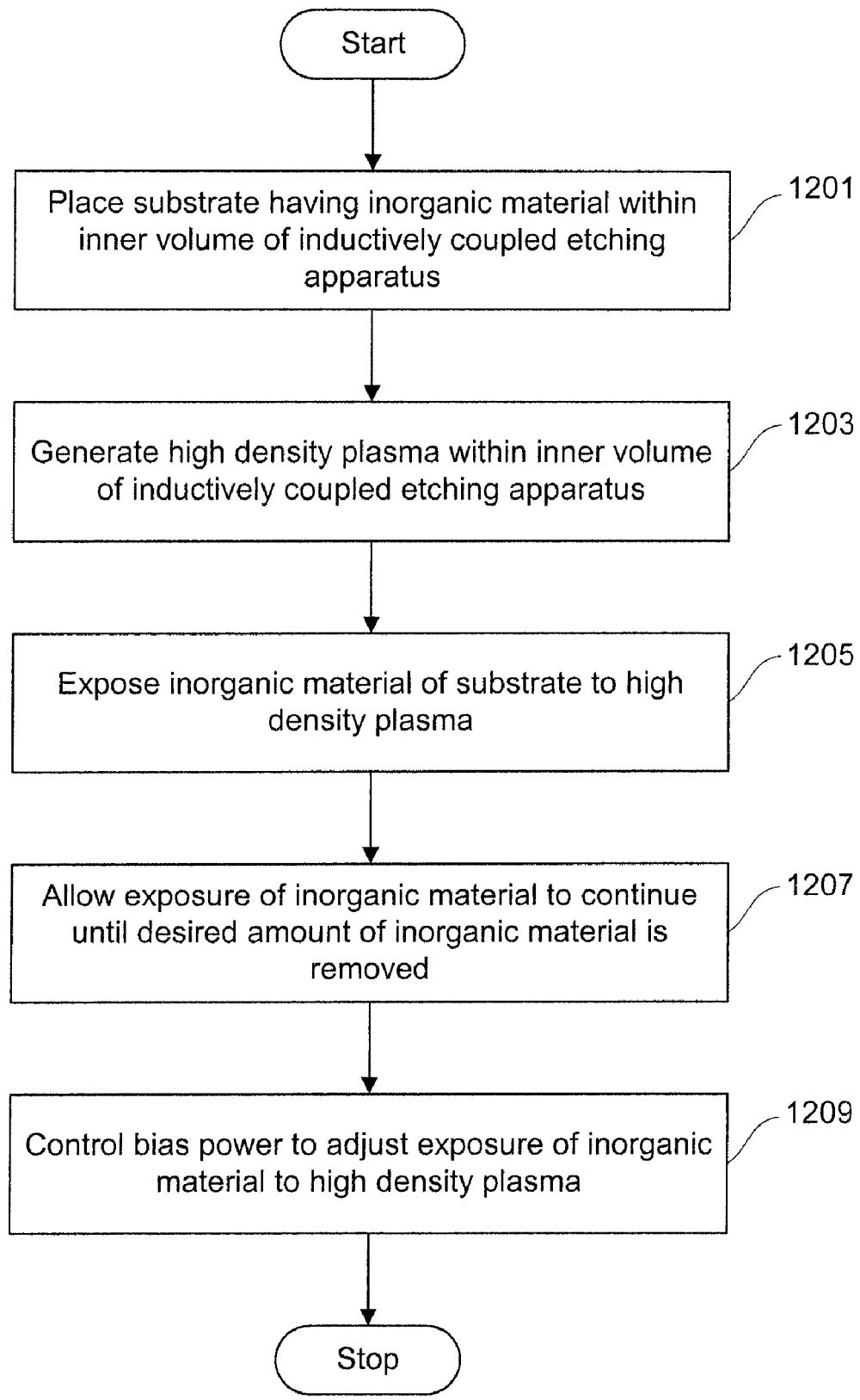
FIG. 12 is an illustration showing a flowchart of a method for trimming an inorganic material, in accordance with one embodiment of the present invention.

FIG. 12 is an illustration showing a flowchart of a method for trimming an inorganic material, in accordance with one embodiment of the present invention. The method includes an operation 1201 for placing a substrate within an inner volume of an inductively coupled etching apparatus, wherein a portion of the substrate is overlaid by an inorganic material. In one embodiment, the substrate may be represented by one or more materials defining a semiconductor wafer. In this embodiment, the inorganic material may represent a hard mask. The inorganic material overlaying the portion of the substrate has a surface defined by both regions that are substantially parallel to and regions that are not parallel to the inner volume of the inductively coupled etching apparatus. In various embodiments, the inorganic material can be either $SiO_2$, $Si_3N_4$, or SiON. However, the inorganic material included in the present method is not limited to these materials. For example, the inorganic material may be another oxide or nitride compound.

The method also includes an operation 1203 in which a high density plasma is generated within the inner volume of the inductively coupled etching apparatus. The high density plasma is generated by applying a high power to a gas within the inner volume. In one embodiment, the high power is applied within a range greater than about 400 Watts. In a particular embodiment, the high power is applied at about 1000 Watts. In various embodiments, the gas can be either $CF_4$, $C_2F_6$, anhydrous HF, or $SF_6$. However, the present method is not limited to these gases. Other gases capable of being converted to a high density plasma for etching inorganic materials can also be used with the present method.

The method continues with an operation 1205 for exposing the surface of the inorganic material to the high density plasma. When exposed to the surface of the inorganic material, the high density plasma causes a portion of the inorganic material to be removed. Since, the high density plasma is distributed in a substantially uniform manner over the surface of the inorganic material, the inorganic material is removed by the high density plasma in a substantially uniform manner. Removal of the inorganic material through exposure to the high density plasma occurs in a substantially uniform manner from both the regions of the inorganic material surface that are substantially parallel to and not parallel to the inner volume of the inductively coupled etching apparatus. In an operation 1207, the exposure of the surface of the inorganic material to the high density plasma is allowed to continue until a desired amount of the inorganic material is removed from the regions of the inorganic material surface that are not parallel to the inner volume of the inductively coupled etching apparatus.

The method further includes an operation 1209 for controlling a bias power to adjust the exposure of the surface of the inorganic material to the high density plasma. Controlling the bias power causes an adjustment in the removal of the inorganic material from the regions of the inorganic material surface that are not parallel to the inner volume of the inductively coupled etching apparatus. In one embodiment, controlling the bias power includes setting the bias power to near zero to cause the high density plasma to isotropically contact the surface of the inorganic material, including the regions of the surface that are not parallel to the inner volume of the inductively coupled etching apparatus.

Figure 13:
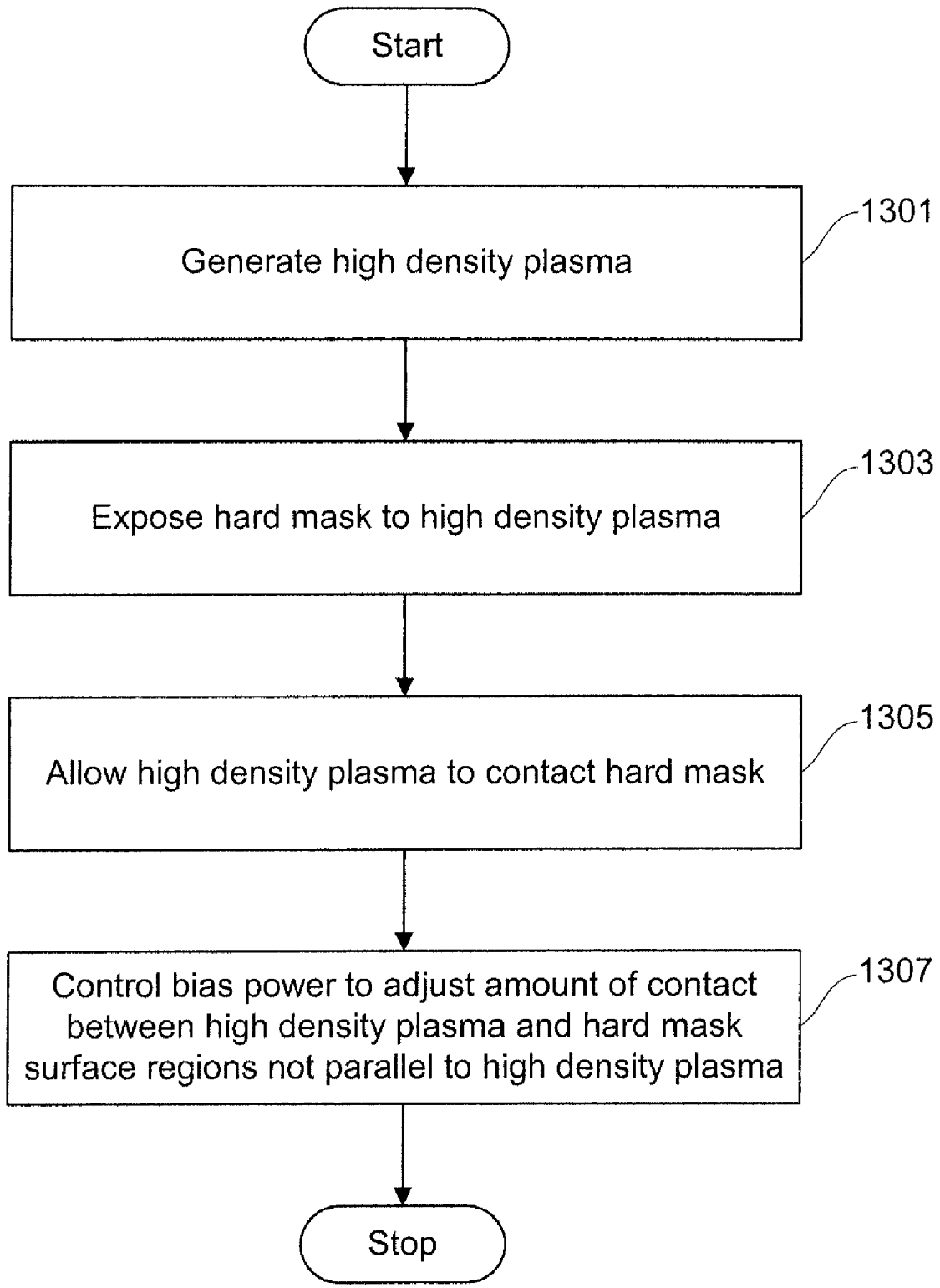
FIG. 13 is an illustration showing a flowchart of a method for controlling a hard mask trim process, in accordance with one embodiment of the present invention.

FIG. 13 is an illustration showing a flowchart of a method for controlling a hard mask trim process, in accordance with one embodiment of the present invention. The method includes an operation 1301 for generating a high density plasma. In one embodiment, the high density plasma is generated in an inner volume of an inductively coupled etching apparatus operating at a high power of at least 400 Watts. The high density plasma is generated by applying the high power to a gas supplied to the inner volume of the inductively coupled etching apparatus. The high power serves to convert the gas into the high density plasma. In various embodiments, the gas can be either $CF_4$, $C_2F_6$, anhydrous HF, or $SF_6$. However, the present method is not limited to these gases. Other gases capable of being converted to a high density plasma for etching inorganic materials can also be used with the present method.

The method also includes an operation 1303 for exposing a hard mask to the high density plasma, wherein the hard mask is an inorganic material. The hard mask has a surface topography defined by regions that are substantially parallel to the high density plasma and regions that are not parallel to the high density plasma. In various embodiments the hard mask is either $SiO_2$, $Si_3N_4$, or SiON. However, the hard mask is not limited to being one of these materials.

The method continues with an operation 1305 in which the high density plasma is allowed to contact the hard mask to cause a portion of the hard mask to be etched. The method further includes an operation 1307 for controlling a bias power to adjust an amount of contact between the high density plasma and the regions of the hard mask surface topography that are not parallel to the high density plasma. In one embodiment, the bias power is controlled to be set to near zero. With the bias power set to near zero, the high density plasma isotropically contacts both the regions of the hard mask surface topography that are substantially parallel to the high density plasma and the regions that are not parallel to the high density plasma.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A semiconductor device, comprising:
   a substrate;
   a polysilicon feature disposed on the substrate so as to have a top surface substantially parallel to the substrate and a side surface substantially perpendicular to the substrate;
   a silicon oxide liner conformally and directly disposed on both a portion of the substrate near the side surface of the polysilicon feature and on the side surface of the polysilicon feature, wherein the silicon oxide liner is not disposed on the top surface of the polysilicon feature; and
   a silicon nitride layer conformally and directly disposed on an entirety of the silicon oxide liner;

wherein the silicon oxide liner is not disposed on a region of the substrate beyond the portion of the substrate near the side surface of the polysilicon feature.

2. A semiconductor device as recited in claim 1, wherein the silicon nitride layer is not disposed directly on the substrate and is not disposed directly on the polysilicon feature.

3. A semiconductor device as recited in claim 1, wherein the silicon oxide liner and silicon nitride layer together form an L-shaped spacer against the side surface of the polysilicon feature.

4. semiconductor device as recited in claim 1, wherein the silicon oxide liner and the silicon nitride layer extend from the substrate up the side surface of the polysilicon feature to a location below the top surface of the polysilicon feature.

5. A semiconductor device as recited in claim 1, wherein a critical dimension of the semiconductor device is determined by the portion of the substrate near the side surface of the polysilicon feature upon which the silicon oxide liner is directly disposed.

6. A semiconductor device as recited in claim 1, wherein the polysilicon feature includes a second side surface substantially perpendicular to the substrate, and wherein a second silicon oxide liner is conformally and directly disposed on both a portion of the substrate near the second side surface of the polysilicon feature and on the second side surface of the polysilicon feature, and wherein the second silicon oxide liner is not disposed on the top surface of the polysilicon feature, and wherein a second silicon nitride layer is conformally and directly disposed on the second silicon oxide liner and limited to disposition on the second silicon oxide liner.

7. A semiconductor device as recited in claim 6, wherein the second silicon oxide liner and the second silicon nitride layer extend from the substrate up the second side surface of the polysilicon feature to a location below the top surface of the polysilicon feature.

8. A semiconductor device as recited in claim 1, wherein the substrate is formed of silicon.

9. A semiconductor device as recited in claim 1, wherein the polysilicon feature is defined to form a substantially rectangular shaped line on the substrate.

10. A semiconductor device as recited in claim 1, wherein the silicon oxide liner is defined to have a substantially uniform thickness.

11. A semiconductor device as recited in claim 10, wherein the substantially uniform thickness of the silicon oxide liner is about 100 angstroms.

12. A semiconductor device as recited in claim 1, wherein the silicon nitride layer is defined to have a substantially uniform thickness.

13. A semiconductor device as recited in claim 12, wherein the substantially uniform thickness of the silicon nitride layer is about 200 angstroms.

* * * * *